US012033965B2

(12) United States Patent
Cheng et al.

(10) Patent No.: US 12,033,965 B2
(45) Date of Patent: Jul. 9, 2024

(54) SEMICONDUCTOR DEVICE AND METHOD OF FORMING THE SAME

(71) Applicant: TAIWAN SEMICONDUCTOR MANUFACTURING CO., LTD., Hsinchu (TW)

(72) Inventors: Wen-Hao Cheng, Taichung (TW); Yen-Yu Chen, Taichung (TW); Chih-Wei Lin, Taichung (TW); Yi-Ming Dai, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 18/312,325

(22) Filed: May 4, 2023

(65) Prior Publication Data

US 2023/0275048 A1    Aug. 31, 2023

Related U.S. Application Data

(63) Continuation of application No. 17/383,215, filed on Jul. 22, 2021, now Pat. No. 11,682,639, which is a (Continued)

(51) Int. Cl.
*H01L 23/00* (2006.01)
*H01L 21/56* (2006.01)
(Continued)

(52) U.S. Cl.
CPC .............. *H01L 24/03* (2013.01); *H01L 21/56* (2013.01); *H01L 21/76802* (2013.01);
(Continued)

(58) Field of Classification Search
CPC ... H01L 24/03; H01L 21/56; H01L 21/76802; H01L 21/76888; H01L 23/3171; H01L 23/5226; H01L 24/08; H01L 21/76843; H01L 21/76856; H01L 2224/02126; H01L 2224/02166; H01L 2224/0401; H01L 2224/05124; H01L 2224/05147; H01L 2224/05166; H01L 2224/05181; H01L 2224/05184; H01L 2224/05186;
(Continued)

(56) References Cited

U.S. PATENT DOCUMENTS 6,429,524 B1   8/2002   Cooney, III et al.
6,489,229 B1   12/2002  Sheridan et al.
(Continued)

FOREIGN PATENT DOCUMENTS

CN    1615538 A    5/2005
CN    1650398 A    8/2005
(Continued)

*Primary Examiner* — Jonathan Han
(74) *Attorney, Agent, or Firm* — Maschoff Brennan

(57) ABSTRACT

A method is provided. The method includes forming an interconnect structure electrically connected to a semiconductor device; forming a tantalum-based barrier layer over the interconnect structure; oxidizing the tantalum-based barrier layer to form a tantalum oxide over the tantalum-based barrier layer; and forming a metal layer over the tantalum oxide.

20 Claims, 10 Drawing Sheets

Related U.S. Application Data continuation of application No. 16/430,075, filed on Jun. 3, 2019, now Pat. No. 11,075,179.

(60) Provisional application No. 62/725,200, filed on Aug. 30, 2018.

(51) Int. Cl.
*H01L 21/768* (2006.01)
*H01L 23/31* (2006.01)
*H01L 23/522* (2006.01)

(52) U.S. Cl.
CPC .... *H01L 21/76888* (2013.01); *H01L 23/3171* (2013.01); *H01L 23/5226* (2013.01); *H01L 24/08* (2013.01)

(58) Field of Classification Search
CPC . H01L 2224/05624; H01L 2224/05647; H01L 21/67184; H01L 21/67207; H01L 23/564; H01L 2224/05005; H01L 2224/05016; H01L 2224/05022; H01L 2224/05027; H01L 2224/0508; H01L 2224/05559; H01L 24/05; H01L 23/5283; H01L 21/76224; H01L 2924/00012; H01L 2924/206; H01L 2924/013; H01L 2924/00014; H01L 2924/04941; H01L 2924/01028; H01L 2924/01058; H01L 2924/01077; H01L 2924/01046; H01L 2924/01042; H01L 2924/01078; H01L 2924/01044; H01L 2924/01079; H01L 2924/04953; H01L 2924/01045
See application file for complete search history.

(56) References Cited

U.S. PATENT DOCUMENTS

| | | | |
|---|---|---|---|
| 6,495,449 B1 | 12/2002 | Nguyen | |
| 6,583,507 B1 | 6/2003 | Moon et al. | |
| 6,787,831 B2 | 9/2004 | Moon et al. | |
| 6,936,535 B2 | 8/2005 | Kim et al. | |
| 8,324,730 B2 | 12/2012 | Koike et al. | |
| 8,722,531 B1 | 5/2014 | Lin et al. | |
| 2002/0149105 A1 | 10/2002 | Yoon et al. | |
| 2002/0180043 A1 | 12/2002 | Asahina et al. | |
| 2003/0001186 A1 | 1/2003 | Kweon | |
| 2003/0111729 A1 | 6/2003 | Leu et al. | |
| 2003/0194859 A1* | 10/2003 | Huang | H01L 21/76862 438/652 |
| 2007/0096264 A1 | 5/2007 | Wu et al. | |
| 2010/0038792 A1 | 2/2010 | Ochimizu et al. | |
| 2011/0057317 A1* | 3/2011 | Koike | H01L 21/76877 438/653 |
| 2012/0273949 A1 | 11/2012 | Liu et al. | |
| 2013/0241064 A1* | 9/2013 | Lin | H01L 24/03 257/E21.59 |
| 2014/0183743 A1* | 7/2014 | Matsumoto | H01L 21/76814 438/653 |
| 2015/0179592 A1 | 6/2015 | Jain | |
| 2015/0214157 A1 | 7/2015 | Canaperi et al. | |
| 2015/0311150 A1 | 10/2015 | Lin et al. | |
| 2016/0056112 A1 | 2/2016 | Edelstein et al. | |
| 2016/0181386 A1 | 6/2016 | Chi et al. | |

FOREIGN PATENT DOCUMENTS

| | | |
|---|---|---|
| CN | 1653613 A | 8/2005 |
| CN | 102760694 A | 10/2012 |
| CN | 104051323 A | 9/2014 |
| CN | 104821275 A | 8/2015 |
| CN | 105006467 A | 10/2015 |
| KR | 2002-0044824 A | 6/2002 |
| TW | 388107 B | 4/2000 |
| TW | 469590 B | 12/2001 |
| TW | 201034153 A | 9/2010 |
| TW | 201338109 A | 9/2013 |
| TW | 201419445 A | 5/2014 |

* cited by examiner

SEMICONDUCTOR DEVICE AND METHOD OF FORMING THE SAME

PRIORITY CLAIM AND CROSS-REFERENCE

The present application is a Continuation application of U.S. application Ser. No. 17/383,215, filed on Jul. 22, 2021, which is a Continuation application of U.S. application Ser. No. 16/430,075, filed on Jun. 3, 2019, now U.S. Pat. No. 11,075,179, issued on Jul. 27, 2021, which claims priority to U.S. provisional application Ser. No. 62/725,200, filed on Aug. 30, 2018, which is hereby incorporated by reference in its entirety.

BACKGROUND

A semiconductor device includes one or numerous conductive metal layers serving as metal interconnect. The conductive metal layers couple various device components to one another through dielectric materials. The conductive metal layers are formed over one another and positioned at various device levels. Further, the semiconductor device includes an uppermost or top metal layer serving as a part of a pad structure. Hence, the top metal layer may electrically couple a solder bump or other external component, so as to enable electrical connection to the semiconductor device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
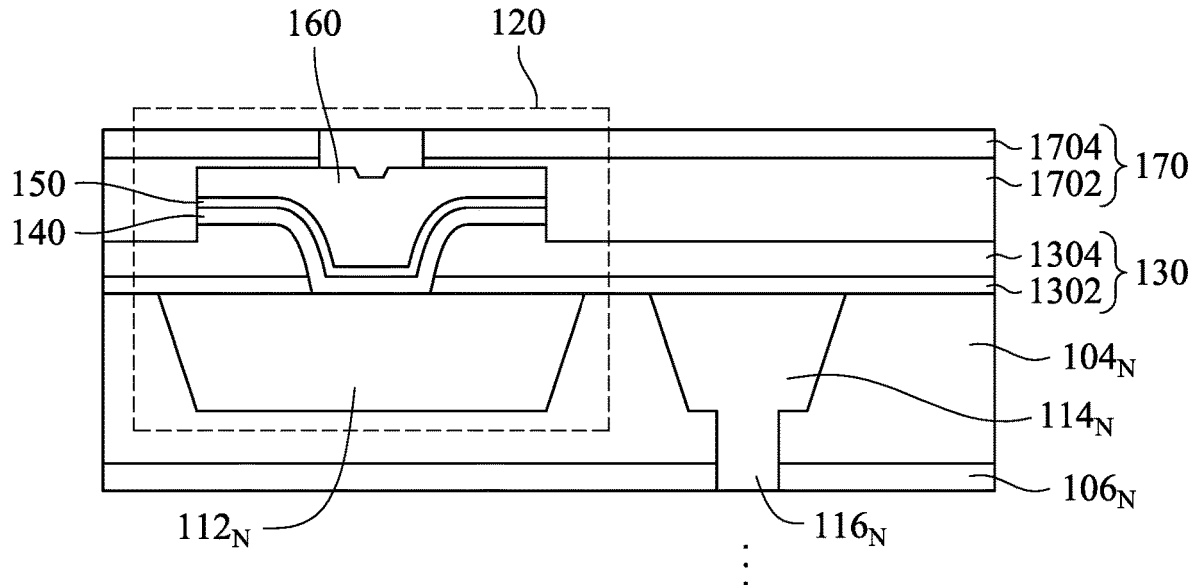
FIG. 1 is a schematic diagram illustrating a semiconductor device with a bond pad structure in accordance with some embodiments of the present disclosure.
Figure 1:
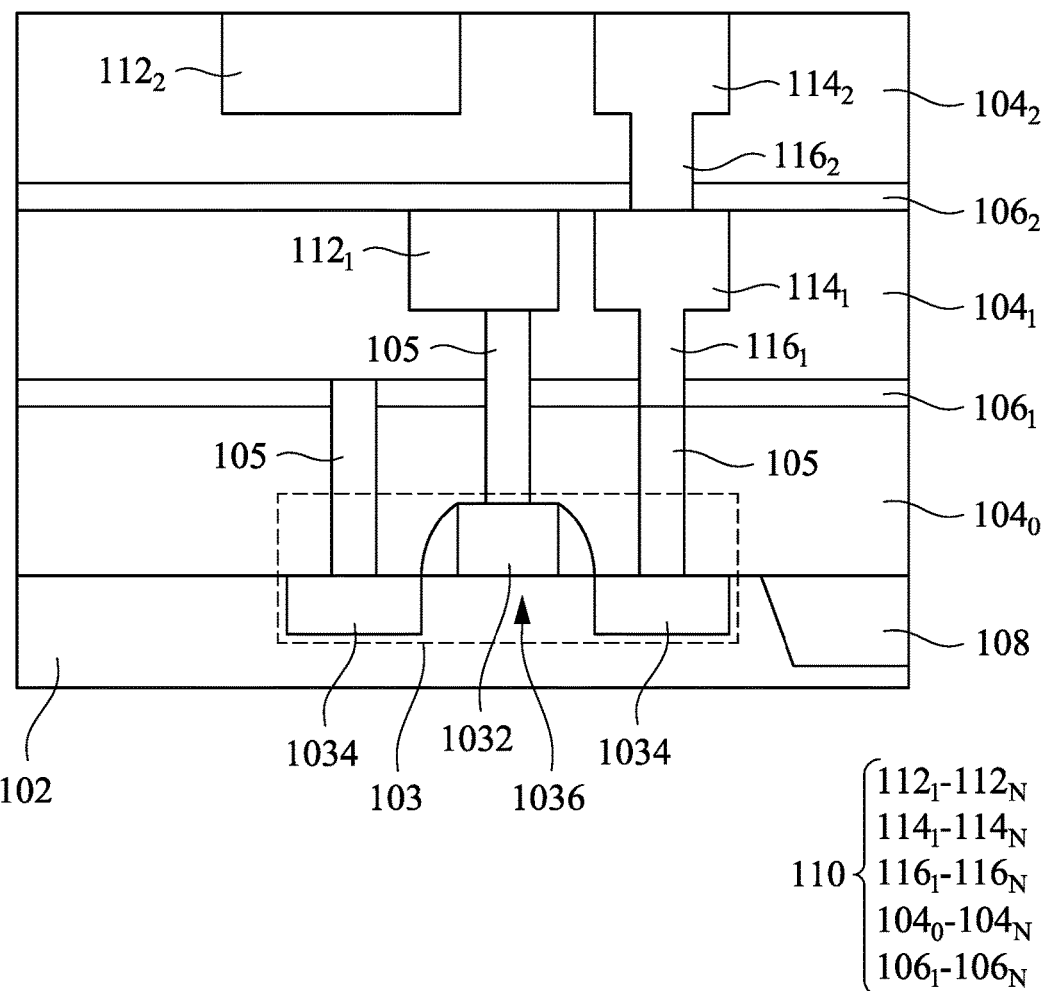

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one component or feature's relationship to another component(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around," "about," "substantially" or "approximately" shall generally mean within 20 percent, within 10 percent, or within 5 percent of a given value or range. Numerical quantities given herein are approximate, meaning that the term "around," "about," "substantially" or "approximately" can be inferred if not expressly stated.

A bond pad structure in a semiconductor device may include a plurality of layers to collectively enable electrical connection to the semiconductor device. However, moisture and/or contamination during the fabrication of the bond pad structure may trigger a whisker defect issue that jeopardizes a performance of the semiconductor device. Additionally, localization of internal stress in the bond pad structure may be another cause of the whisker defect issue. The whisker defect issue is a phenomenon that whisker-like projections may occur on a metallic surface of the bond pad structure and in turn cause short circuit and/or other damages to the semiconductor device. Additionally, the whisker defect issue may also result from presence of compressive stress in the bond pad structure. Consequently, in an effort to adequately address the above-mentioned issue, a semiconductor device and a method of forming the same are presented in accordance with various embodiments of the present disclosure as follows.

Reference is made to FIG. 1, which is a schematic diagram illustrating a semiconductor device 100 with a bond pad structure 120 in accordance with some embodiments of the present disclosure. In some embodiments, the semiconductor device 100 may include passive components (e.g., resistor, capacitor, inductor and fuses), active components (e.g., P-channel field effect transistor (PFET), N-channel field effect transistor (NFET), metal-oxide-semiconductor field effect transistor (MOSFET), complementary metal-oxide-semiconductor transistor (CMOS), high voltage transistor and high frequency transistor), other suitable components, and/or combinations thereof. It is noted that a person skilled in the art may appreciate that the above-mentioned examples are provided for the purpose of illustration only and not meant to limit the present disclosure in any manner. Other circuitry may be also included in the semiconductor device 100 based on various designs.

As shown in FIG. 1, the semiconductor device 100 has a substrate 102. In some embodiments, the substrate 102 may be formed of silicon, germanium suitable III-V compound materials (e.g., germanium arsenide (GaA)), combinations thereof, or the like. In some embodiments, the substrate 102 may include a silicon on insulator (SOI) structure. In detail, the SOI structure may have a layer of a semiconductor material, such as silicon, formed on an insulator layer. The insulator layer may include a buried oxide (BOX) layer and/or a silicon oxide layer. It is noted that the substrate 102 may include another elementary semiconductor, such as germanium, a compound semiconductor including silicon carbide, gallium arsenic, gallium phosphide, indium phosphide, indium arsenide and indium antimonide, an alloy semiconductor including SiGe, GaAsP, AlInAs, AlGaAs, GaInAs, GaInP and GaInAsP, or combinations thereof. Additionally, other types of substrates, such as a multilayer substrate, a gradient substrate, or combinations thereof, may also be adopted.

In some embodiments, an active component like the transistor 103 is formed on the substrate 102. The transistor 103 includes a gate structure 1032, source/drain regions 1034, and a channel region 1036 to amplify or switch electronic signals and electrical power. In some embodiments, a shallow trench isolation (STI) 108 is adjacent to the transistor 103 to prevent electric current leakage between the transistor 103 and adjacent components. In some embodiments, a dielectric layer $104_0$ is configured to surround the transistor 103 as an inter-metal layer and may include oxide material, extreme low-k dielectric (ELK), insulating material, combinations thereof, or the like. In some embodiments, an etch stop layer $106_1$ is configured on the dielectric layer $104_0$ and may include silicon carbide (SiC) or other suitable materials. The SiC is a material that may stably operate at high temperature and/or high voltage and thus suitable for applying to the semiconductor device 100.

In some embodiments, the interconnect structure 110 of the semiconductor device 100 may include a plurality of dielectric layers $104_0$, $104_1$, $104_2$ ... $104_N$ ($104_0$-$104_N$), etch stop layers $106_1$, $106_2$ ... $106_N$ ($106_1$-$106_N$), conductive portions $112_1$, $112_2$ ... $112_N$ ($112_1$-$112_N$), conductive lines $114_1$, $114_2$ ... $114_N$ ($114_1$-$114_N$), and conductive vias $116_1$, $116_2$ ... $116_N$ ($116_1$-$116_N$). The conductive portions $112_1$-$112_N$, the conductive lines $114_1$-$114_N$, and/or the conductive vias $116_1$-$116_N$ may be routed through the dielectric layers $104_0$-$104_N$ and/or etch stop layers $106_1$-$106_N$ to make connection between the transistor 103 and the external electronic members. For example, as shown in FIG. 1, the dielectric layer $104_0$, the etch stop layer $106_1$, the dielectric layer $104_1$, the etch stop layer $106_2$, the dielectric layer $104_2$ ... the etch stop layer $106_N$, and the dielectric layer $104_N$ are arranged and stacked in a sequence from bottom to top. The conductive plugs 105 are routed through the dielectric layer $104_0$ and/or the etch stop layer $106_1$ to make connections between the conductive portion $112_1$ and the gate structure 1032 and/or between the conductive line $114_1$ and the source/drain region 1034. The conductive portion $112_1$ and the conductive line $114_1$ may be coupled to each other. The conductive via $116_2$ may bridge the conductive line $114_1$ and the conductive line $114_2$. Similar structural configuration as mentioned above may be also applied to the conductive line $114_2$, the conductive via $116_N$, the conductive line $114_N$, the conductive portion $112_2$, and the conductive portion $112_N$. In some embodiments, the conductive plugs 105, the conductive lines $114_1$-$114_N$, and the conductive vias $116_1$-$116_N$ may be also arranged along a non-linear path to make connection between the transistor 103 and the bond pad structure 120. In some embodiments, the conductive plugs 105, the conductive lines $114_1$-$114_N$, the conductive vias $116_1$-$116_N$ and the conductive portions $112_1$-$112_N$ may include metal based materials, e.g., copper (Cu), that have a good conductive property.

In some embodiments, the interconnect structure 110 may be formed by damascene process, dual-damascene process, combinations thereof, or the like. For example, a trench etching process may be conducted to form a plurality of trenches. Subsequently, a metallic material like copper may be provided in the trenches as a medium for electrical transmission. Consequently, the interconnect structure 110 may be formed as a part of an integrated circuit in the semiconductor device 100.

In some embodiments, a first passivation layer 130 is positioned on the interconnect structure 110. The first passivation layer 130 may include oxide, nitride, undoped silicate glass (USG), combinations thereof, or the like. In some embodiments, a second passivation layer 170 is positioned on the first passivation layer 130. The second passivation layer 170 may include oxide, nitride, undoped silicate glass (USG), combinations thereof, or the like. The first passivation layer 130 and/or the second passivation layer 170 are configured to protect the underlying components against corrosion, scratch, and/or damage from an external environment. In some embodiments, the first passivation layer 130 may include a multilayer structure, such as a first layer 1302 and a second layer 1304. For example, the first layer 1302 may include silicon nitride (SiN) and the second layer 1304 may include undoped silicate glass (USG). In some embodiments, the second passivation layer 170 may include a multilayer structure, such as a first layer 1702 and a second layer 1704. For example, the first layer 1702 may include undoped silicate glass (USG) and the second layer 1704 may include silicon nitride (SiN). It is noted that structural configurations of the first passivation layer 130 and the second passivation layer 170 are examples and not intended to be limiting.

In some embodiments, the bond pad structure 120 is configured through the first passivation layer 130 and the second passivation layer 170, such that the semiconductor device 100 may be bonded to and connected with an external electronic member through the bond pad structure 120. More specifically, the bond pad structure 120 (emphasized by the rectangular dotted line) may be a stacked structure including the conductive portion $112_N$, the first passivation layer 130, a barrier layer 140, an oxidation layer 150, a pad metal layer 160, and the second passivation layer 170. Since the oxidation layer 150 may separate the barrier layer 140 and the pad metal layer 160, contamination and/or moisture resulted from the barrier layer 140 may be blocked and prevented from causing negative influence on the pad metal layer 160, such as whisker defect thereon. It is noted that the structural configuration of the above-mentioned components in the bond pad structure 120 may be adjustable based on various designs. Further, more detailed descriptions about the bond pad structure 120 will be presented below.

Figure 2:
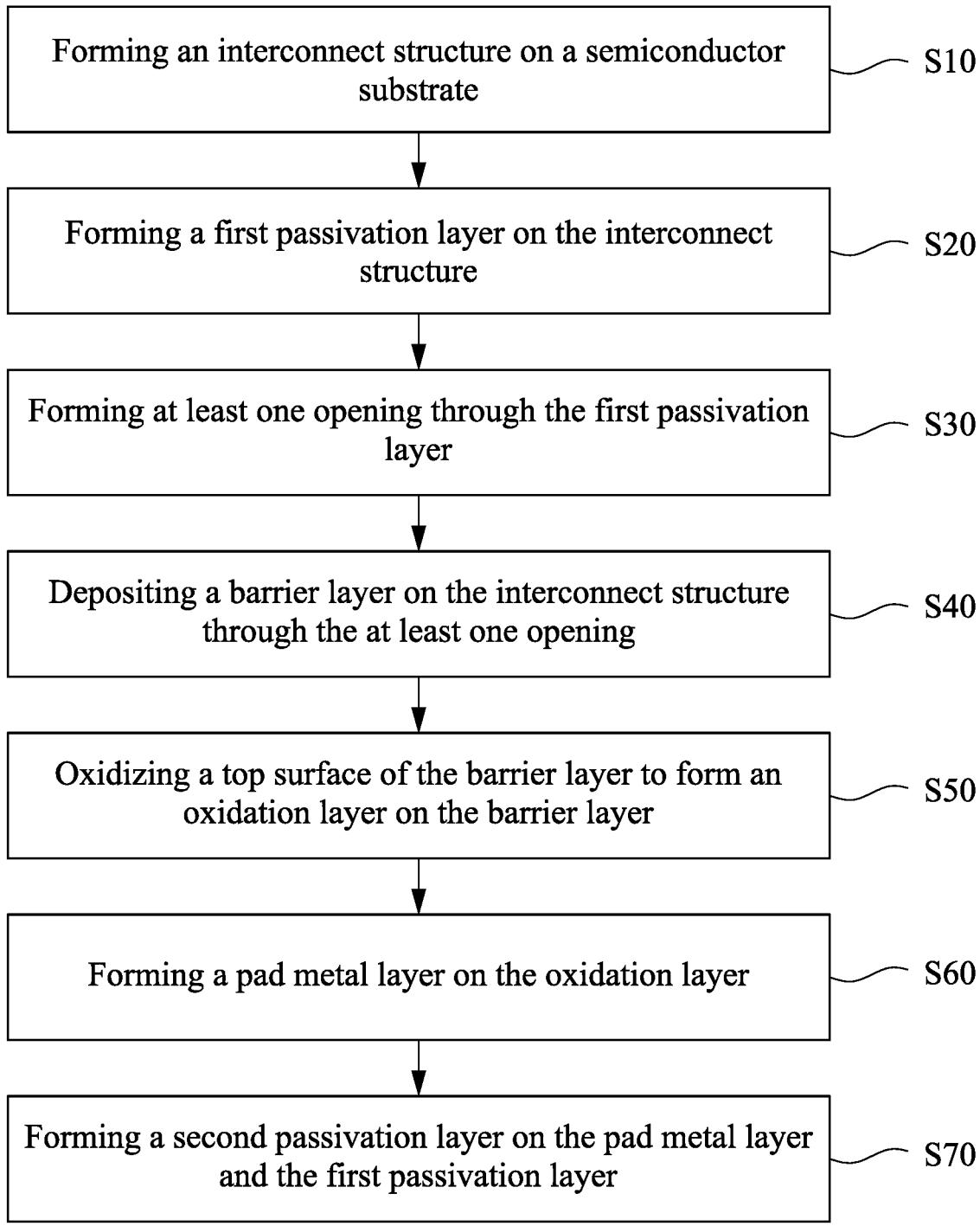
FIG. 2 is a flowchart illustrating a method for forming a bond pad structure of a semiconductor device in accordance with some embodiments of the present disclosure.

Reference is made to FIG. 2, which is a flowchart illustrating a method M1 for forming a bond pad structure 120 in accordance with some embodiments of the present disclosure. More specifically, FIG. 2 illustrates an exemplary embodiment for fabricating the bond pad structure 120 included in the semiconductor device 100. The method M1 may include a relevant part of the fabrication process of the semiconductor device 100. It is noted that each of the methods presented below is merely an example, and not intended to limit the present disclosure beyond what is explicitly recited in the claims. Additional operations may be provided before, during, and after each of the methods. Some operations described may be replaced, eliminated, or moved around for additional embodiments of the fabrication process. Additionally, for clarity and ease of explanation, some elements of the figures have been simplified.

FIGS. 3-10 are schematic diagrams illustrating cross sections at various stages of fabricating the bond pad structure 120 in the semiconductor device 100 according to the method M1 of FIG. 2. More specifically, the operations S10-S70 in FIG. 2 will be cited below in company with the cross sections as illustrated in FIGS. 3-11, so as to collectively describe the detailed fabrication and structure of the bond pad structure 120.

Figure 3:
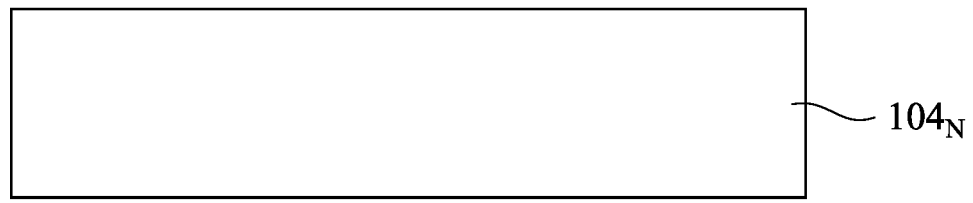
FIGS. 3-11 are schematic diagrams illustrating cross sections at various stages of fabricating the bond pad structure according to the method of FIG. 2.

Reference is made to FIG. 3. The dielectric layer 104$_N$ is provided. More specifically, the dielectric layer 104$_N$ is an intermediate structure of the bond pad structure 120. It is noted that a part of the semiconductor device 100 is particularly illustrated for clarity and ease of explanation of the present disclosure.

In some embodiments, the dielectric layer 104$_N$ of the bond pad structure 120 may include bulk silicon, doped silicon, undoped silicon, dielectric materials, other suitable elements, or combinations thereof. Further, the dielectric layer 104$_N$ of the bond pad structure 120 may be an intermetal dielectric (IMD) layer. In some embodiments, the IMD layer may be made of phosphosilicate glass (PSG), borophosphosilicate glass (BPSG), fluorosilicate glass (FSG), SiOxCy, Spin-On-Glass, Spin-On-Polymers, silicon carbon material, low-k dielectric material, compounds thereof, composites thereof, combinations thereof, or the like, through any suitable method, e.g., spin-on coating, chemical vapor deposition (CVD), plasma-enhanced CVD (PECVD), combinations thereof, or the like.

Figure 4:
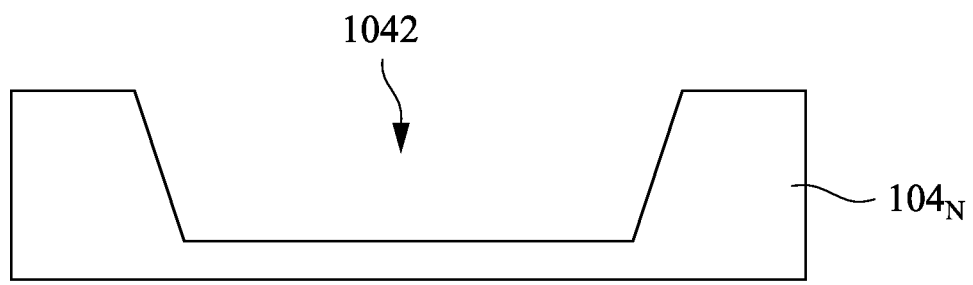

Reference is made to FIG. 4. A recess 104$_2$ (or a groove) is formed in the dielectric layer 104$_N$. The recess 104$_2$ may be formed by any suitable etching process, such as wet etching, dry etching, combinations thereof, or the like. In some embodiments, tetramethylammonium hydroxide (TMAH) is utilized in an anisotropic wet etching process. In some embodiments, the dry etching process is performed by an etching gas that includes $O_2$, $Cl_2$, HBr, He, $NF_3$, $CO_2$, $C_xH_yF_z$, Ar, $N_2$, $H_2$, combinations thereof, or the like. In some embodiments, the recess 104$_2$ has an inclined sidewall. In some embodiments, the recess 104$_2$ of the dielectric layer 104$_N$ may be formed by any suitable process, such as damascene process, dual-damascene process, combinations thereof, or the like, so as to form a trench with desired shape based on various designs. In some embodiments, another recess (not shown in FIG. 4) is formed in the dielectric layer 104$_N$ for forming the conductive line 114$_N$. That is, the recess 104$_2$ and the recess for forming the conductive line 114$_N$ may be formed in the same etching process.

Figure 5:

Reference is made to FIG. 5. A conductive portion 112$_N$ of the interconnect structure 110 is formed in the recess 104$_2$. According to the above-mentioned descriptions regarding FIG. 1, the conductive portion 112$_N$ may be routed through the dielectric layer 104$_N$ to connect the conductive line 114$_N$, such that the conductive portion 112$_N$, the conductive line 114$_N$, and the conductive via 116$_N$ of the interconnect structure 110 may become a part of the electrical connection between external electronic members and the components like the transistor 103 in the semiconductor device 100. The conductive portion 112$_N$ may include a conductive material, such as copper, aluminum, tungsten, combinations thereof, or the like. In some embodiments, the conductive portion 112$_N$ of the interconnect structure 110 may be formed by any suitable process, such as damascene process, dual-damascene process, combinations thereof, or the like, so as to fill the recess 104$_2$ with the conductive material. In some embodiments, the conductive line 114$_N$ may be formed with the conductive portion 112$_N$.

In some embodiments, the conductive portion 112$_N$ (and the conductive line 114$_N$) of the semiconductor device 100 may further include one or more barrier or adhesion layer between the conductive portion 112$_N$ and the dielectric layer 104$_N$, such that the metallic contamination due to metallic diffusion from the conductive portion 112$_N$ into the dielectric layer 104$_N$ may be prevented. Additionally, the barrier or adhesion layer may include titanium, titanium nitride, tantalum, tantalum nitride, combinations thereof, or the like, and may be formed by using chemical vapor deposition (CVD), physical vapor deposition (PVD), atomic layer deposition (ALD), and a combination thereof, or the like.

In some embodiments, the conductive portion 112$_N$ (and the conductive line 114$_N$) may be formed by depositing conductive materials over the structure of FIG. 4, the conductive materials may fill the recess 104$_2$ (and the recess for forming the conductive line 114$_N$) and also overlie the dielectric layer 104$_N$. Subsequently, a planarization operation may be performed to planarize a top surface of the conductive materials with a top surface of the dielectric layer 104$_N$ to form the conductive portion 112$_N$ (and the conductive line 114$_N$). Further, the planarization operation may include using a chemical mechanical polishing (CMP) process. Consequently, as shown in FIG. 5, the top surface of the conductive portion 112$_N$ may be coplanar with that of the dielectric layer 104$_N$.

It is noted that the method M1 may start with the operation S10 which includes forming the interconnect structure 110 on the substrate 102 of the semiconductor device 100. Further, the fabrication processes of the bond pad structure 120 as illustrated in FIGS. 3-5 are conducted, such that the conductive portion 112$_N$ of the interconnect structure 110 may be formed in and exposed by the dielectric layer 104$_N$ as an intermediate structure.

Figure 6:
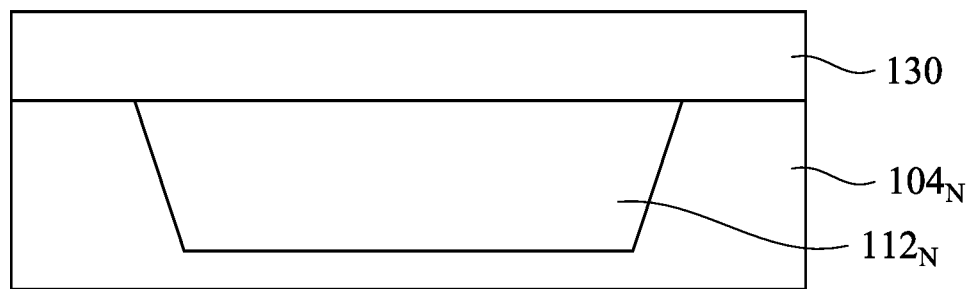

Reference is made to FIG. 6. The method M1 may proceed with the operation S20 which includes forming the first passivation layer 130 on the interconnect structure 110. More specifically, the first passivation layer 130 is formed on the conductive portion 112$_N$ and the dielectric layer 104$_N$. The first passivation layer 130 may include oxide, nitride, dielectric material, combinations thereof, or the like. The first passivation layer 130 may have a hard non-reactive property that protects the underlying components against corrosion, scratch, and/or damage from an external environment.

In some embodiments, as shown in FIG. 1, the first passivation layer 130 may include a multilayer structure, such as the first layer 1302 and the second layer 1304 as shown in FIG. 1. For example, the first layer 1302 may include silicon nitride (SiN) while the second layer 1304 may include undoped silicate glass (USG), and vice versa. The multilayer structure may be formed layer by layer through different deposition processes, other suitable processes, or the like. Consequently, the configuration of the first passivation layer 130 may be adjusted based on various designs, e.g., the material of the first passivation layer 130 may be selected based on the material of component therebelow, such that the protecting performance thereof may be improved.

Figure 7:
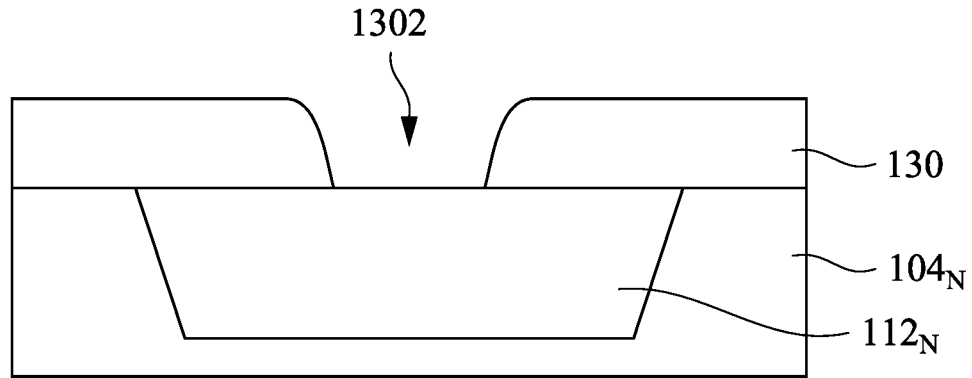

Reference is made to FIG. 7. The method M1 may proceed with the operation S30 which includes forming at least one opening 1302 through the first passivation layer 130. More specifically, the first passivation layer 130 may be patterned and/or etched to form the opening 1302 therein, such that the opening 1302 may expose a portion of the top surface of the conductive portion $112_N$. In some embodiments, at least one etching process, such as wet etching, photochemical etching, dry etching, plasma etching, or combinations thereof, may be selectively performed to make the opening 1302 with a directional or anisotropic structure. For example, as shown in FIG. 7, the opening 1302 may have curved and/or downwardly convergent sidewalls. In some embodiments, the opening 1302 may be aligned with a center of the top surface of the conductive portion $112_N$, such that the bond pad structure 120 may be configured to be symmetric to a normal of the top surface of the conductive portion $112_N$. In some other embodiments, the opening 1302 may be misaligned with the center of the top surface of the conductive portion $112_N$. Embodiments fall within the present disclosure as long as the opening 1302 exposes the conductive portion $112_N$. It is noted that the opening 1302 may be referred to as contact opening, through hole, or the like.

Figure 8:
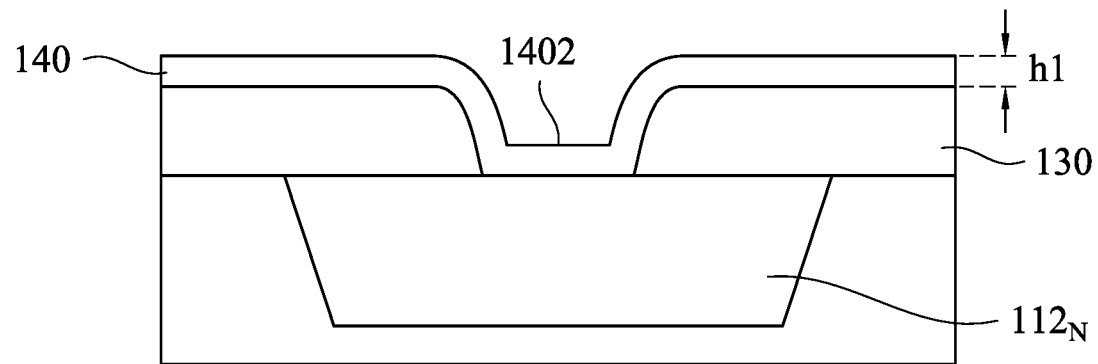

Reference is made to FIG. 8. The method M1 may proceed with the operation S40 which includes depositing a barrier layer 140 on the conductive portion $112_N$ of the interconnect structure 110 through the opening 1302. More specifically, the barrier layer 140 is deposited over the structure of FIG. 7, and particularly, on a portion of the conductive portion $112_N$ through the opening 1302. In some embodiments, the barrier layer 140 may include tantalum (Ta) based material, such as tantalum, tantalum nitride (TaN), a combination thereof, or the like. In some embodiments, the barrier layer 140 may be formed by at least one depositing process, such as physical vapor deposition (PVD), atomic layer deposition, chemical vapor deposition, plasma enhanced atomic layer deposition, molecular beam epitaxy, ion beam assisted deposition, combinations thereof, or the like. As shown in FIG. 8, the barrier layer 140 may have a thickness h1 and overlie the conductive portion $112_N$ and the first passivation layer 130 to seal off the exposed conductive portion $112_N$. Consequently, the barrier layer 140 may protect the conductive portion $112_N$ from external damage and/or prevent the inter-diffusion between the conductive portion $112_N$ and any component which will be subsequently formed thereon.

Figure 9:
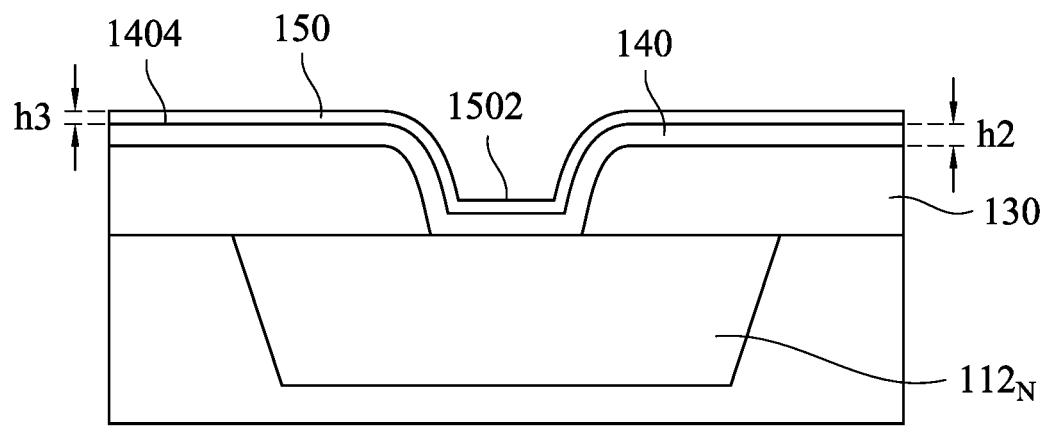

Reference is made to FIG. 9. The method M1 may proceed with the operation S50 which includes oxidizing the top surface 1402 of the barrier layer 140 as shown in FIG. 8 to form an oxidation layer 150 on the barrier layer 140. More specifically, as shown in FIG. 9, the oxidation layer 150 is formed immediately on the top surface 1404 of the barrier layer 140 using at least one oxidation process. In some embodiments, the oxidation layer 150 may include metal oxide. The oxidation layer 150 and the barrier layer 140 include the same metal. If the barrier layer 140 is made of tantalum nitride, the oxidation layer 150 may include tantalum (Ta) based material, $Ta_xO_y$, combinations thereof, or the like. In some embodiments, the oxidation layer 150 may be free of nitrogen. Or, a nitrogen concentration of the oxidation layer 150 is lower than an oxygen concentration of the oxidation layer 150. Additionally, since tantalum based material may include a porous structure that has minute spaces or holes therein, the oxidation layer 150 may capture moisture and/or contamination resulted from the barrier layer 140 and also prevent localization of internal stress in the bond pad structure 120. Consequently, possible whisker defect issue of the bond pad structure 120 may be mitigated.

In some embodiments, the oxidation process includes exposing the top surface 1402 of the barrier layer 140 to an oxidant gas by a time period. Further, the oxidant gas may be provided to shroud and oxidize the top surface 1402 of the barrier layer 140. The oxidant gas may include nitrogen and oxygen. Nitrogen is substantially inert such that interaction between nitrogen and the barrier layer 140 may be prevented. Through adjusting a flow ratio of nitrogen to oxygen, the oxidation of the barrier layer 140 may be appropriately controlled to form the oxidation layer 150 with desired structure and/or character. In some embodiments, a flow ratio of nitrogen to oxygen provided to the barrier layer 140 may be in a range between about 1/1000 and about 1000/1. For example, when a flow rate of nitrogen is about 1 standard cubic centimeter per minute (sccm), a flow rate of oxygen would be about 1000 sccm, and vice versa. If the flow ratio of the oxidation process is out of the above-mentioned range, undesired structure and/or character of the oxidation layer 150 may occur and adversely affect the performance of the semiconductor device 100.

On the other hand, in some embodiments, the time period of the oxidation process may be in a range between about 10 seconds and about 600 seconds. If the time period is greater than about 600 seconds, the oxidation layer 150 would be too thick and adversely influence the electrical transmission. In other words, the contact resistance of the bond pad structure 120 may be increased. Conversely, if the time period is smaller than about 10 seconds, the oxidation layer 150 would be too thin to provide sufficient structural strength and/or sufficient protection against the whisker defect issue.

Additionally, in some embodiments, the oxidation process may be performed at a temperature in a range between about 25° C. (or room temperature) and about 100° C. If the temperature is higher than about 100° C., the contact resistance of the oxidation layer 150 may be increased. Conversely, if the temperature is lower than about 25° C., an undesired structure of the oxidation layer 150 may occur and adversely affect the performance of the semiconductor device 100.

Consequently, a thickness h3 of the oxidation layer 150 may be controllable based on various designs, e.g., in a range between about 1 angstrom (Å) and about 500 Å. If the thickness h3 is greater than about 500 Å, the oxidation layer 150 would be too thick and adversely influence the electrical transmission. Conversely, if the thickness h3 is smaller than about 1 Å, the oxidation layer 150 would be too thin to provide sufficient structural strength and/or sufficient protection against the whisker defect issue.

In some embodiments, due to the deliberate and controllable oxidation process, the thickness of the oxidation layer 150 may be adjustable based on various designs. More specifically, the oxidation process may transform a top portion of the barrier layer 140 into the oxidation layer 150. That is, the formation of the oxidation layer 150 may involve consuming a portion of the barrier layer 140. Further, during the oxidation process, with respect to the barrier layer 140 in FIG. 8, the top portion of the barrier layer 140 may be transformed downwardly from the top surface 1402 thereof while a portion of the oxidation layer 150 may be formed upwardly from the top surface 1402 thereof. In other words, the oxidation layer 150 may develop from the top surface 1402 of the barrier layer 140 as shown in FIG. 8.

For example, the thickness of the barrier layer 140 in FIG. 8 may be denoted as h1, the thickness of the barrier layer 140 in FIG. 9 may be denoted as h2, and the thickness of the oxidation layer 150 in FIG. 9 may be denoted as h3. When the oxidation process may consume the barrier layer 140 from the top surface 1402 thereof, the thickness h1 would be greater than the thickness h2. Due to the consumption of the barrier layer 140, the top surface 1402 thereof in FIG. 8 may be downwardly transformed to the top surface 1404 thereof in FIG. 9. Additionally, when a portion of the oxidation layer 150 may be formed upwardly from the top surface 1402 of the barrier layer 140, the sum of the thickness h2 and the thickness h3 would be greater than the thickness h1. Furthermore, the thickness h3 may be smaller than the thickness h2 in some embodiments.

In accordance with the above-mentioned descriptions about the barrier layer 140 and the oxidation layer 150, it is understood that the oxidation layer 150 may be directly transformed from the top portion of the barrier layer 140 and may also develop from the top surface 1402 of the barrier layer 140 at the same time. Hence, the oxidation layer 150 may be conformal with the barrier layer 140, e.g., the top surface 1502 of the oxidation layer 150 may be conformal as the top surface 1404 of the barrier layer 140.

On the other hand, since the oxidation layer 150 is formed by oxidizing the top portion of the barrier layer 140, an ingredient of the oxidation layer 150 may be substantially the same as the barrier layer 140. In some embodiments, the tantalum based material of the oxidation layer 150 may be substantially the same as the barrier layer 140. Additionally, since the oxidant gas is continuously provided by a time period, the top portion of the growing oxidation layer 150 may be exposed to more oxidant gas than the bottom portion thereof, such that an oxide concentration of the oxidation layer 150 may peak at the side of the oxidation layer 150 away from the barrier layer 140, i.e., at the side of the oxidation layer 150 adjacent to the pad metal layer 160 that will be subsequently formed on the oxidation layer 150. That is, the oxide concentration of the oxidation layer 150 may decrease downwardly. It is noted that the concentration mentioned above is a number concentration defined as a number of entities of a constituent (e.g., the oxide) in a mixture (e.g., the oxidation layer 150) divided by a volume of the mixture.

Figure 10:
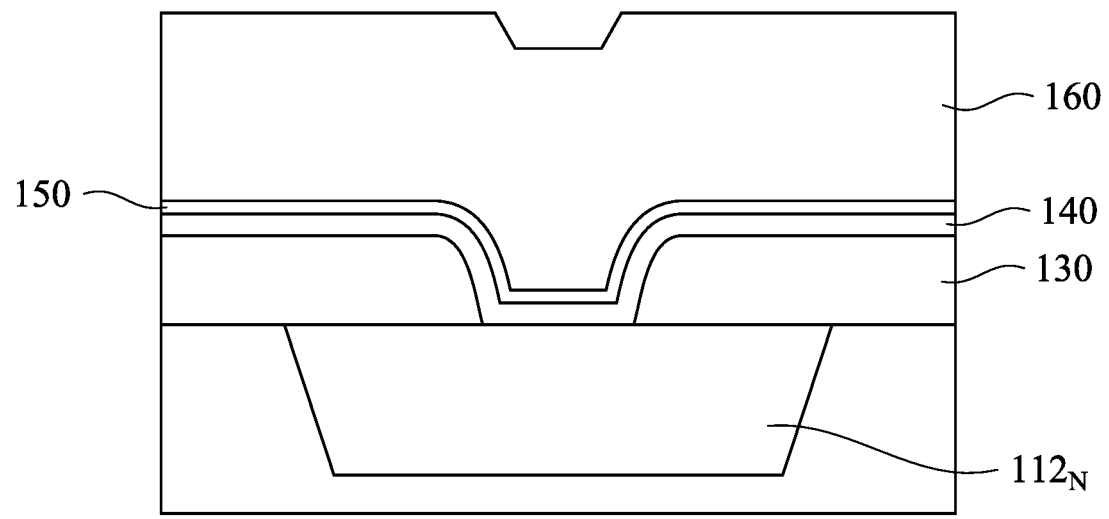

Reference is made to FIG. 10. The method M1 may proceed with the operation S60 which includes forming a pad metal layer 160 on the oxidation layer 150. More specifically, the pad metal layer 160 may include aluminum (Al) based material, copper (Cu) based material, combinations thereof, or the like, so as to enable electrical connection to the semiconductor device 100. In some embodiments, the pad metal layer 160 may be formed by at least one of the above-mentioned depositing processes. Due to the configuration of the barrier layer 140 and the oxidation layer 150 as described above, interdiffusion between the conductive portion 112$_N$ and the pad metal layer 160 may be prevented. On the other hand, as discussed above, the oxidation layer 150 may have the porous structure to contain moisture and/or contamination resulted from the barrier layer 140. Additionally, the porous structure may also function as a buffer to alleviate localization of internal stress between the barrier layer 140 and the pad metal layer 160. Consequently, possible whisker defect issue on the pad metal layer 160 may be mitigated.

In some embodiments, after the formation of the pad metal layer 160, at least one etching process may be performed to pattern the barrier layer 140, the oxidation layer 150, and the pad metal layer 160. In some embodiments, the first passivation layer 130 may be etched as well. Through the at least one etching process, desired structural configuration with respect to the bond pad structure 120 may be achieved.

Figure 11:
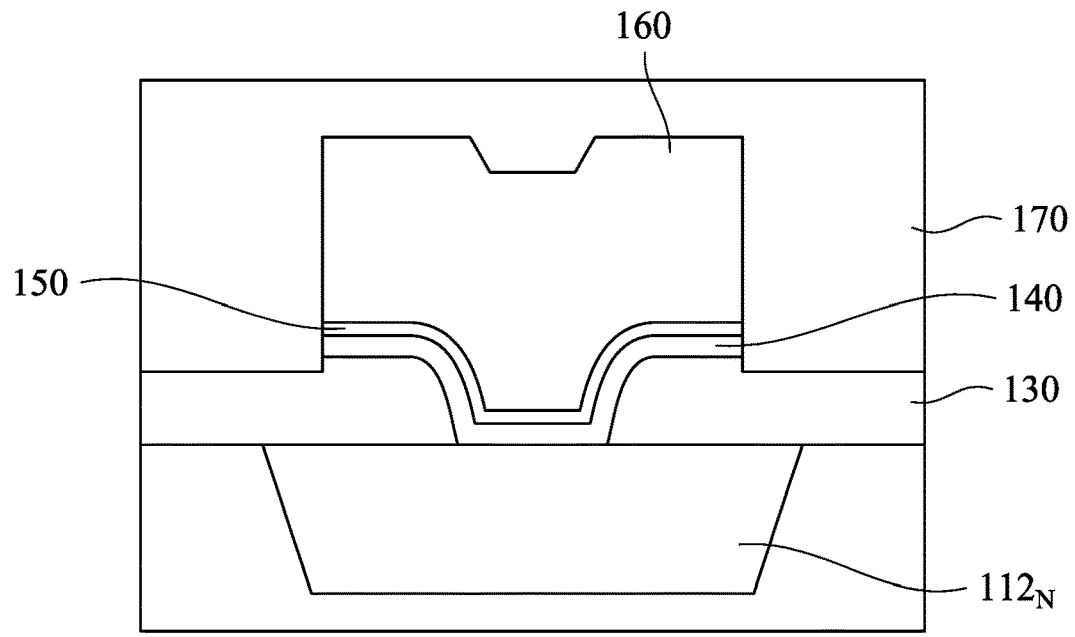

Reference is made to FIG. 11. The method M1 may proceed with the operation S70 which includes forming a second passivation layer 170 on the pad metal layer 160 and the first passivation layer 130. More specifically, a second passivation layer 170 may be formed on the first passivation layer 130 the barrier layer 140, the oxidation layer 150, and the pad metal layer 160. For example, the second passivation layer 170 may be formed by at least one of the above-mentioned depositing processes. The second passivation layer 170 may include oxide, nitride, dielectric material, combinations thereof, or the like. Consequently, the second passivation layer 170 may protect the underlying components against corrosion, scratch, and/or damage from an external environment.

In some embodiments, the second passivation layer 170 may include a multilayer structure, such as the first layer 1702 and the second layer 1704 as shown in FIG. 1. For example, the first layer 1702 may include undoped silicate glass (USG) and the second layer 1704 may include silicon nitride (SiN). The multilayer structure may be formed layer by layer through different deposition processes, other suitable processes, or the like. Consequently, the protecting performance of the second passivation layer 170 may be increased.

In some embodiments, a chemical mechanical polishing (CMP) process may be subsequently performed to the structure of FIG. 11, such that the pad metal layer 160 may be exposed as shown in FIG. 1 and ready for bonding and/or contacting of external electronic members. Further, according to different bonding and/or contacting conditions, additional process like etching process may be performed to the structure of FIG. 1, such that a desired shape, e.g., a trench on the pad metal layer 160, may be subsequently achieved to improve the bonding and/or contacting.

In some embodiments, a cap layer may be further formed on the exposed pad metal layer 160 to provide a smooth surface for bonding and/or contacting of the external electronic members. In some embodiments, the cap layer may include a metallic material that has a good conductive property, such as pure aluminum, aluminum based alloy, any suitable metallic material, and a combination thereof. It is noted that the aluminum based alloy may be a combination of pure aluminum and at least one of the following metallic materials, such as palladium (Pd), nickel (Ni), gold (Au), platinum (Pt), ruthenium (Ru), rhodium (Rh), iridium (Ir), cerium (Ce), and molybdenum (Mo).

Figure 12:
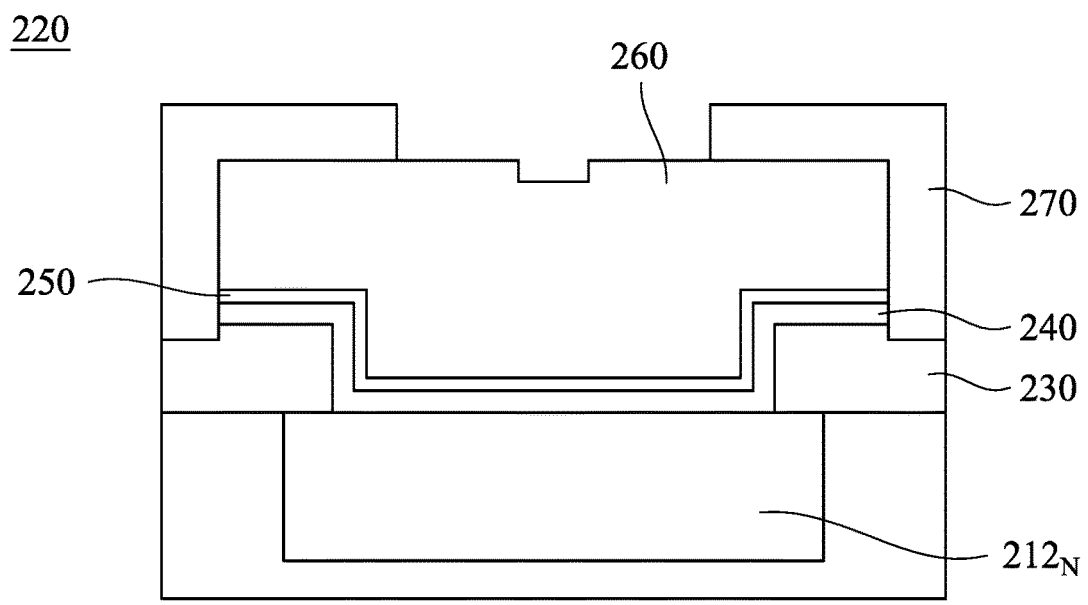
FIG. 12 is a schematic diagram illustrating a bond pad structure in accordance with some other embodiments of the present disclosure.

Reference is made to FIG. 12, which is a schematic diagram illustrating the bond pad structure 220 in accordance with some other embodiments of the present disclosure. Since some components of FIG. 12 are similar to those corresponding components of FIG. 11, descriptions for those similar components will not be repeated hereinafter. As shown in FIG. 12, the conductive portion 212N is formed with a rectangular cross section. The first passivation layer 230 has vertical sidewalls that form an opening therebetween. Similarly, the barrier layer 240, the oxidation layer 250, the pad metal layer 260, and the second passivation layer 270 may be sequentially formed on the conductive portion 212N and the first passivation layer 230 by any suitable process described above based on various designs.

Figure 13:
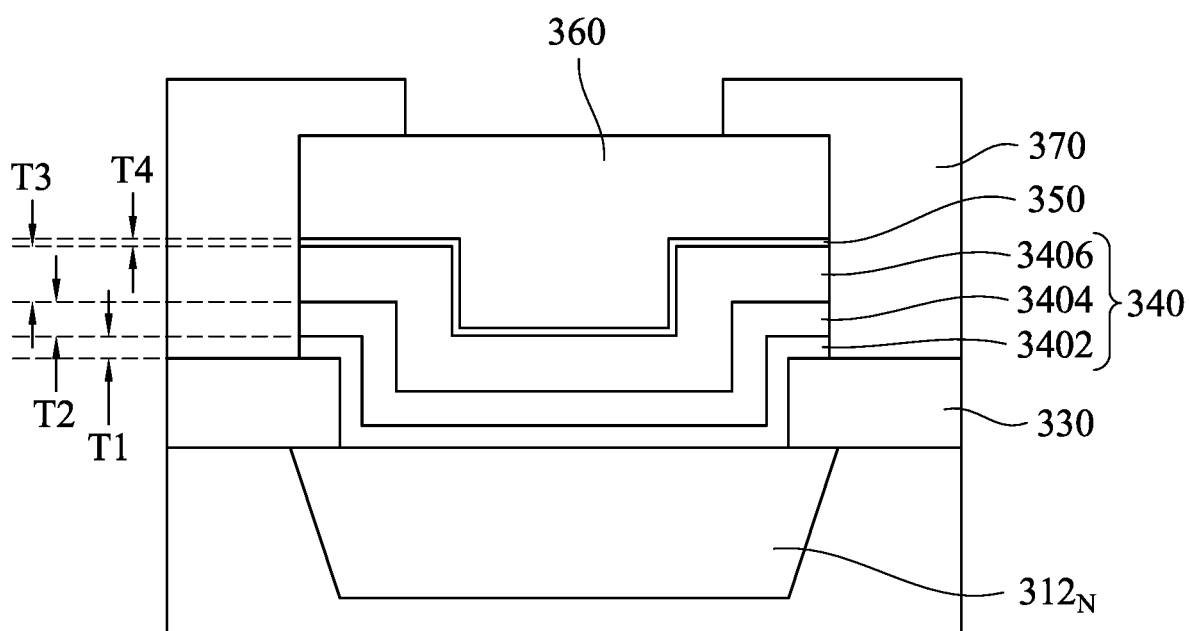
FIG. 13 is a schematic diagram illustrating a bond pad structure in accordance with yet another embodiment of the present disclosure.

Reference is made to FIG. 13, which is a schematic diagram illustrating the bond pad structure 320 in accordance with yet another embodiment of the present disclosure. Since some components of FIG. 13 are similar to those corresponding components of FIG. 12, descriptions for those similar components will not be repeated hereinafter. Similarly, the barrier layer 340, the oxidation layer 350, the pad metal layer 360, and the second passivation layer 370 may be sequentially formed on the conductive portion 312N and the first passivation layer 330 by any suitable process described above based on various designs. In some embodiments, the first passivation layer 330 is not etched when the pad metal layer 360 and its overlying elements are patterned, such that a top surface thereof may have a uniform height.

In some embodiments, the barrier layer 340 may include a multilayer structure. As shown in FIG. 13, the barrier layer 340 may include three respective layers. Further, a first layer 3402, a second layer 3404, and a third layer 3406 may be arranged in a sequence from bottom to top. Each layer of the multilayer structure of the barrier layer 340 may be respectively formed by at least one of the above-mentioned depositing processes. In some embodiments, the first layer 3402 may be a metal layer (e.g., tantalum layer), the second layer 3404 may be a metal nitride layer (e.g., tantalum nitride layer), and the third layer 3406 may be a metal nitride layer (e.g., tantalum nitride layer).

Additionally, the thickness of the first layer 3402 may be denoted as T1, the thickness of the second layer 3404 may be denoted as T2, and the thickness of the third layer 3406 may be denoted as T3. In some embodiments, the thickness T3 is greater than the thickness T2. In some embodiments, the thickness T2 is greater than the thickness T1. It is noted that the thickness of each layer of the multilayer structure may be controlled by adjusting deposition parameter(s) of depositing process based on various designs. For example, the second layer 3404 may be formed by a deposition power ranging between about 400 watts (W) and about 600 W (e.g., 500 W), such that a thickness T2 thereof may range between about 50 Å and about 70 Å (e.g., 60 Å). For another example, the third layer 3406 may be formed by a deposition power ranging between about 5000 W and about 7000 W (e.g., 6000 W), such that a thickness T3 thereof may range between about 500 Å and about 700 Å (e.g., 600 Å). Therefore, the second layer 3404 may act as a buffer layer to protect underlying components and/or structure against corrosion, scratch, and/or damage during formation of other components (e.g., the third layer 3406) thereon.

In some embodiments, when the second layer 3404 and the third layer 3406 are both made of tantalum nitride, at least one of them may further include other materials like metals to be equipped with different properties for tackling some specific conditions. In some embodiments, the barrier layer 340 may include metal nitride and/or metal while being free of oxide. Consequently, due to the configuration of the multilayer structure, the protecting performance of the barrier layer 340 may be further enhanced.

Additionally, the oxidation layer 350 may be formed by oxidizing the third layer 3406 of the barrier layer 340. As such, the oxidation layer 350 and the third layer 3406 may include the same metal. The thickness of the oxidation layer 350 may be denoted as T4 and has a smallest value among the thicknesses T1, T2, T3, and T4.

Figure 14:
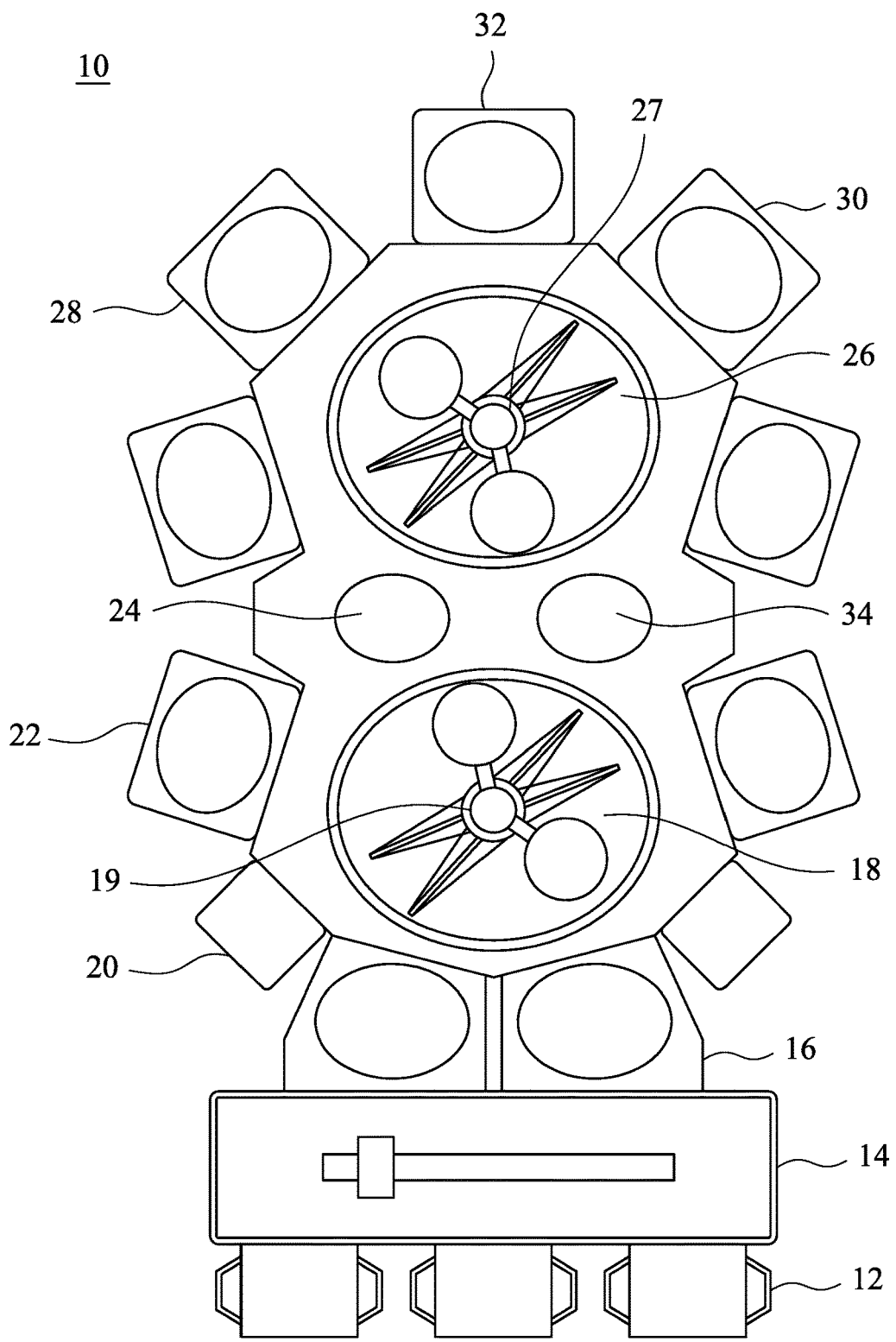
FIG. 14 is a schematic diagram illustrating a wafer processing apparatus in accordance with some embodiments of the present disclosure.

Reference is made to FIG. 14, which is a schematic diagram illustrating a wafer processing apparatus 10 in accordance with some embodiments of the present disclosure. In some embodiments, the operations S40, S50, and/or S60 of FIG. 2 may be performed in the wafer processing apparatus 10. More specifically, the wafer processing apparatus 10 may include a plurality of front opening unified pod (FOUP) 12, a load port 14, load lock chambers 16, a plurality of processing chambers 20, 22, 28, 30, 32, pass through chambers 24, 34, transfer chambers 18, 26, transfer robots 19, 27, along with other components such as power supplies and vacuum pumps. The detailed features of the wafer processing apparatus 10 will be described below.

In some embodiments, each front opening unified pod (FOUP) 12 may contain a plurality of wafers therein. The FOUP 12 may be transported in a semiconductor fabrication plant (FAB). When the FOUP is transported to the wafer processing apparatus 10 in the FAB, the FOUP may be loaded and connected to the load port 14. The load port 14 is connected to the load lock chambers 16. The load lock chambers 16 are connected to the transfer chamber 18. The pass through chambers 24, 34 are connected between the transfer chambers 18, 26 respectively. The processing chambers 20, 22 may be connected to the transfer chamber 18. The processing chambers 28, 30, 32 may be connected to the transfer chamber 26. The transfer chambers 18, 26 are equipped with transfer robots 19, 27 respectively to transport the wafers between the aforementioned components of the wafer processing apparatus 10.

In some embodiments, the processing chambers 20, 22, 28, 30, 32 are used to perform various semiconductor manufacturing sequences respectively. For example, the processing chamber 20 may be a degas chamber, the processing chamber 22 may be a pre-clean chamber, the processing chambers 28, 32 may be deposition chambers, and the processing chamber 30 may be an oxidation chamber. Further, the unmarked processing chambers as shown in FIG. 14 may be backup chambers for the aforementioned chambers or assigned to perform additional semiconductor manufacturing sequences, e.g., rapid thermal process (RTP), chemical vapor deposition (CVD), physical vapor deposition (PVD), and ionized metal plasma process (IMP), based on various designs. In some embodiments, the pass through chambers 24, 34 may be also used to cool down the wafers between the semiconductor manufacturing sequences.

Figure 15:
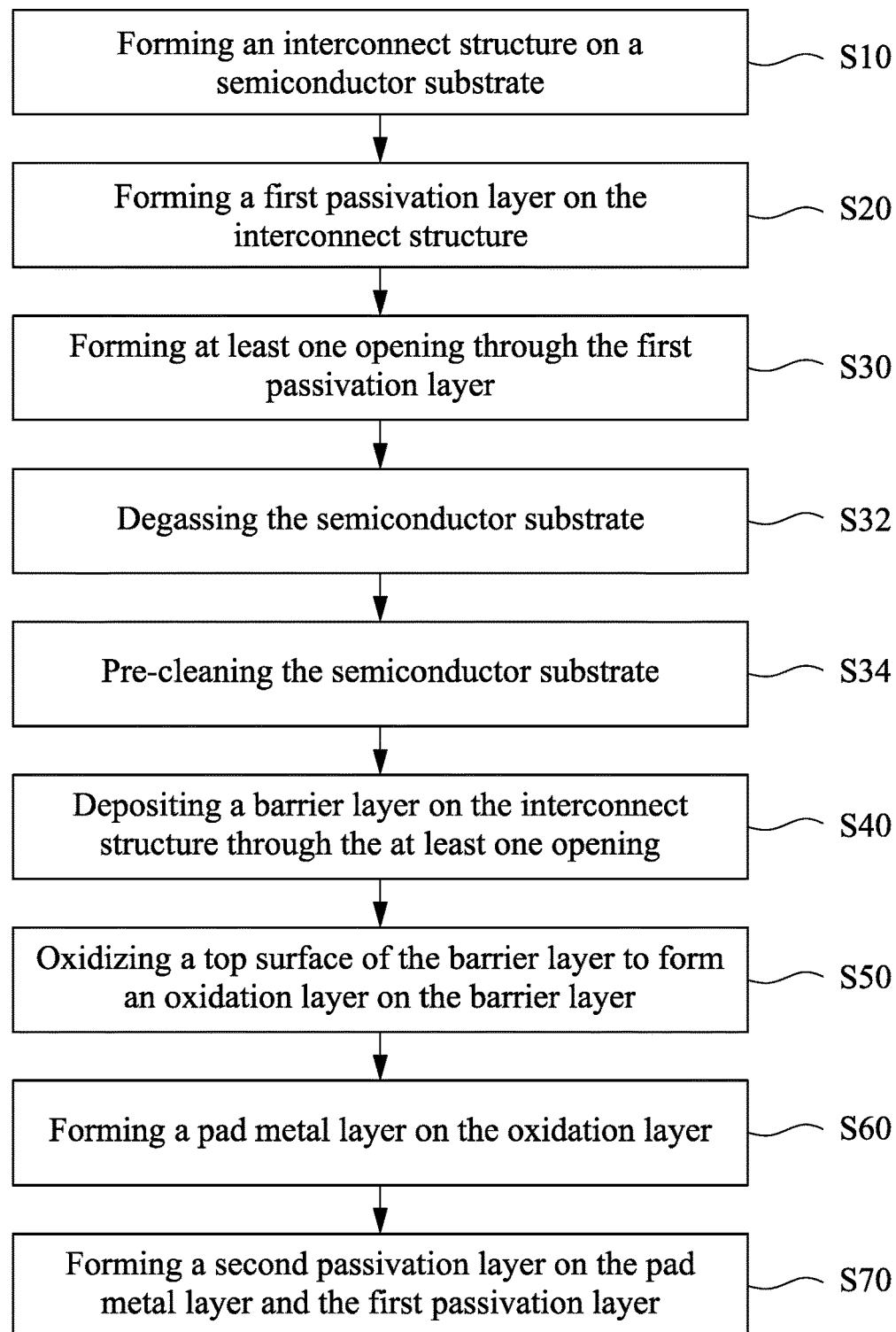
FIG. 15 is a flowchart illustrating a method for forming a bond pad structure of a semiconductor device in accordance with some other embodiments of the present disclosure.

Reference is made to FIG. 15, which is a flowchart illustrating a method M2 for forming the bond pad structure 120 of the semiconductor device 100 in accordance with some embodiments of the present disclosure. Since some operations of method M1 as shown in FIG. 2 are similar to those corresponding operations of method M2 as shown in FIG. 14, descriptions for those similar operations will not be repeated hereinafter. For illustration purposes, the wafer processing apparatus 10 as shown in FIG. 14 is referenced to collectively describe the details of the method M2 as follows.

In some embodiments, the operations S10-S30 are sequentially conducted to a semiconductor substrate, such that an unfinished semiconductor device with a structure as shown in the FIG. 7 may be provided. The unfinished semiconductor device may be sequentially contained in the FOUP 12, transported to the wafer processing apparatus 10, unloaded at the load port 14, and transferred into the load lock chamber 16 to prepare for the following manufacturing sequences. For example, the vacuum pump may vacuum the load lock chamber 16 to prevent exterior contaminations from entering the wafer processing apparatus 10.

In some embodiments, the operation S32 includes degassing the unfinished semiconductor device. More specifically, the transfer robot 19 may move the unfinished semiconductor device (the wafer in FIG. 7 in this case) from the load lock chamber 16 to the processing chamber 20 for performing a degas process. During the degas process, the wafer may be heated to activate impurities remaining thereon. Subsequently, the vacuum pump may be applied to discharge the activated impurities to the exterior. In some embodiments, a reactant gas like hydrogen ($H_2$) gas may be further provided to the wafer to remove and/or prevent formation of an undesired oxide layer thereon. In some embodiments, the degassing process is directed to the conductive portion $112_N$ with or without the first passivation layer 130.

In some embodiments, the operation S34 includes pre-cleaning the unfinished semiconductor device. More specifically, after the degas process, the transfer robot 19 may move the wafer from the processing chamber 20 to the processing chamber 22 for performing a pre-cleaning process. The pre-cleaning process is conducted to remove undesired layer, material, and object on the wafer. In some embodiments, the pre-cleaning process may include sputter etching process, remote plasma cleaning (RPC) process, combinations thereof, or the like. In some embodiments, the pre-cleaning process is directed to the conductive portion 112$_N$ with or without the first passivation layer 130.

In some embodiments, after the pre-cleaning process, the wafer may be moved from the processing chamber 22 to the pass through chamber 24, the transfer chamber 26, and the processing chamber 28 each by each. Subsequently, a variety of barrier layers as discussed above may be formed in the processing chamber 28 through the operation S40.

In some embodiments, the operation S50, i.e., the oxidation process, may be in-situ performed in the processing chamber 28 to form the oxidation layer on the barrier layer. An oxygen source is provided to the processing chamber 28 after the formation of the barrier layer(s). In some other embodiments, the operations S40, S50 are performed in the processing chambers 28, 30 respectively. In detail, the wafer may be moved from the processing chamber 28 to the processing chamber 30 under a vacuum condition. Subsequently, the operation S50 may be conducted in the processing chamber 30.

In some embodiments, after the oxidation process, the operation S60 may be conducted in the processing chamber 32 to form the pad metal layer on the oxidation layer. Additionally, the wafer may be moved to the transfer chamber 26, pass through chamber 34, the transfer chamber 18, the load lock chamber 16, the load port 14, and the FOUP 12 each by each. Consequently, the operations S60, S70 and other suitable processes may be conducted to form a variety of bond pad structures as discussed above.

Based on the above-mentioned descriptions, various advantages may be provided by the present disclosure. In detail, a barrier layer of a bond pad structure may go through an oxidation process to develop an oxidation layer from a top surface of the barrier layer. Additionally, the oxidation process may be manipulated to provide the oxidation layer with controllable thickness based on various designs. The oxidation layer may capture moisture and/or contaminations resulted from the barrier layer and also prevent localization of internal stress in the bond pad structure. Consequently, possible whisker defect issue of the bond pad structure may be mitigated.

In some embodiments, a method includes forming an interconnect structure electrically connected to a semiconductor device; forming a tantalum-based barrier layer over the interconnect structure; oxidizing the tantalum-based barrier layer to form a tantalum oxide over the tantalum-based barrier layer; and forming a metal layer over the tantalum oxide.

In some embodiments, a method includes forming an interconnect structure electrically connected to a semiconductor device; forming a metal layer over the interconnect structure; forming a first metal nitride layer over the metal layer; forming a second metal nitride layer over the first metal nitride layer; forming an oxide layer over the second metal nitride layer, wherein the oxide layer is an oxide of the second metal nitride layer; and forming a pad metal layer over the oxide layer.

In some embodiments, a method includes forming an interconnect structure electrically connected to a semiconductor device; forming a metal layer over the interconnect structure; forming a first metal nitride layer over the metal layer; exposing the first metal nitride layer to nitrogen and oxygen, so as to form an oxide layer over the first metal nitride layer, wherein a nitrogen concentration of the oxide layer is lower than an oxygen concentration of the oxide layer; and forming a pad metal layer over the oxide layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming an interconnect structure electrically connected to a semiconductor device;
   forming a tantalum-based barrier layer over the interconnect structure in a process chamber;
   oxidizing the tantalum-based barrier layer to form a tantalum oxide over the tantalum-based barrier layer, wherein oxidizing the tantalum-based barrier layer is in-situ performed in the process chamber; and
   forming a metal layer over the tantalum oxide.

2. The method of claim 1, wherein oxidizing the tantalum-based barrier layer is performed using an oxidant comprising oxygen and nitrogen.

3. The method of claim 2, wherein the tantalum oxide is substantially free of nitrogen.

4. The method of claim 1, wherein oxidizing the tantalum-based barrier layer is performed such that a thickness of the tantalum-based barrier layer is decreased.

5. The method of claim 1, wherein a thickness of the tantalum oxide is less than a thickness of the tantalum-based barrier layer.

6. The method of claim 1, further comprising:
   patterning the metal layer, the tantalum oxide, and the tantalum-based barrier layer; and
   forming a passivation layer in contact with sidewalls of the metal layer, the tantalum oxide, and the tantalum-based barrier layer.

7. The method of claim 1, wherein the tantalum-based barrier layer comprises tantalum nitride.

8. The method of claim 1, wherein the tantalum-based barrier layer is a multi-layer structure comprising:
   a tantalum layer; and
   a first tantalum nitride layer over the tantalum layer.

9. The method of claim 8, wherein the multi-layer structure further comprises a second tantalum nitride layer over the first tantalum nitride layer.

10. A method, comprising:
    forming an interconnect structure electrically connected to a semiconductor device;
    forming a metal layer over the interconnect structure;
    forming a first metal nitride layer over the metal layer;
    forming a second metal nitride layer over the first metal nitride layer;

forming an oxide layer over the second metal nitride layer, wherein the oxide layer is an oxide of the second metal nitride layer, and an oxygen concentration of the oxide layer decreases downwardly; and forming a pad metal layer over the oxide layer.

11. The method of claim 10, wherein the metal layer, the first metal nitride layer, and the second metal nitride layer are tantalum-based materials.

12. The method of claim 10, wherein a thickness of the oxide is less than thicknesses of the metal layer, the first metal nitride layer, and the second metal nitride layer.

13. The method of claim 10, wherein the oxide layer comprises tantalum oxide.

14. The method of claim 10, wherein the first metal nitride layer and the second metal nitride layer have different thicknesses.

15. The method of claim 10, wherein the metal layer, the first metal nitride layer, and the second metal nitride layer are substantially free of oxide.

16. A method, comprising:
forming an interconnect structure electrically connected to a semiconductor device;
forming a metal layer over the interconnect structure;
forming a first metal nitride layer over the metal layer;
exposing the first metal nitride layer to nitrogen and oxygen, so as to form an oxide layer over the first metal nitride layer, wherein the oxide layer is a thinnest layer among the metal layer, the first metal nitride layer, and the oxide layer; and
forming a pad metal layer over the oxide layer.

17. The method of claim 16, wherein the first metal nitride layer comprises tantalum, and the oxide layer comprises tantalum oxide.

18. The method of claim 16, wherein a thickness of the oxide layer is in a range from about 1 angstrom (Å) to about 500 Å.

19. The method of claim 16, further comprising forming a second metal nitride layer over the metal layer prior to forming the first metal nitride layer.

20. The method of claim 19, wherein the first metal nitride layer and the second metal nitride layer comprise a same metal element.

* * * * *